United States Patent [19]

Ishida

[11] Patent Number: 4,536,709
[45] Date of Patent: Aug. 20, 1985

[54] DETECTING DEVICE HAVING SPACED TRANSMITTING AND RECEIVING COILS FOR DETECTING A METAL STRIP EMBEDDED IN PAPER MONEY

[75] Inventor: Tsuyoshi Ishida, Yokohama, Japan

[73] Assignee: Tokyo Shibaura Denki Kabushiki Kaisha, Kanagawa, Japan

[21] Appl. No.: 645,533

[22] Filed: Aug. 29, 1984

Related U.S. Application Data

[63] Continuation of Ser. No. 326,340, Dec. 1, 1981, abandoned.

[30] Foreign Application Priority Data

Jan. 12, 1981 [JP] Japan .................................. 56-2043
Apr. 2, 1981 [JP] Japan ................................. 56-48400
Jun. 29, 1981 [JP] Japan ................................. 56-99620

[51] Int. Cl.³ ..................... G01N 27/72; G01R 33/12; G06K 7/08
[52] U.S. Cl. ............................... 324/239; 194/100 A; 235/449; 340/675
[58] Field of Search ............... 324/233, 234, 239–243, 324/329; 194/100 R, 100 A; 235/449, 450, 493; 340/675, 676, 551; 209/534, 567, 569

[56] References Cited

U.S. PATENT DOCUMENTS

| 2,217,843 | 10/1940 | Langer | 324/239 |
| 2,513,745 | 7/1950 | Reynolds | 324/239 |
| 2,711,510 | 6/1955 | Tricebock | 324/239 |
| 3,020,472 | 2/1962 | Cauley | 324/233 X |
| 3,286,168 | 11/1966 | Schmidt | 324/233 |
| 3,422,346 | 1/1969 | Hammer | 324/233 |
| 4,063,230 | 12/1977 | Purinton et al. | 324/233 X |

FOREIGN PATENT DOCUMENTS

2830314 10/1980 Fed. Rep. of Germany .
2017996 10/1979 United Kingdom .

Primary Examiner—Gerard R. Strecker
Attorney, Agent, or Firm—Banner, Birch, McKie & Beckett

[57] ABSTRACT

The metal detecting device includes first and second coils provided on both sides of a passageway for paper money. This metal detecting device is designed for use in detecting a metal strip embedded in the paper money in order to determine whether the paper money is genuine or counterfeit. The first coil is connected to a high frequency AC source to generate an AC magnetic field. The second coil is connected to a capacitor to form a resonance circuit which resonates at the same frequency as the AC current. The variation of the Q factor of the resonance circuit due to eddy-current losses produced in the metal strip of the paper money is used by a detecting circuit to determine whether the paper money passing through the space between the first and second coils is genuine.

13 Claims, 38 Drawing Figures

DETECTING DEVICE HAVING SPACED TRANSMITTING AND RECEIVING COILS FOR DETECTING A METAL STRIP EMBEDDED IN PAPER MONEY

This application is a continuation of Ser. No. 326,340 filed Dec. 1, 1981 now abandoned.

BACKGROUND OF THE INVENTION

This invention relates to a detecting device for detecting a metal strip embedded in paper money, such as a check or currency note in order to verify the authenticity of the check or currency note.

In recent years, the high quality of copying or printing machines has resulted in a serious counterfeiting problem. One of the countermeasures against counterfeiting which has been adopted in many countries is the use of a metal embedded in paper checks or currency notes. However, metal detectors for automatically discriminating between genuine and counterfeit currency notes and checks by detecting the metal strip have not been put to practical use because they have not been capable of accurate and reliable detection of the metal strips at high speed.

Figure 1A:
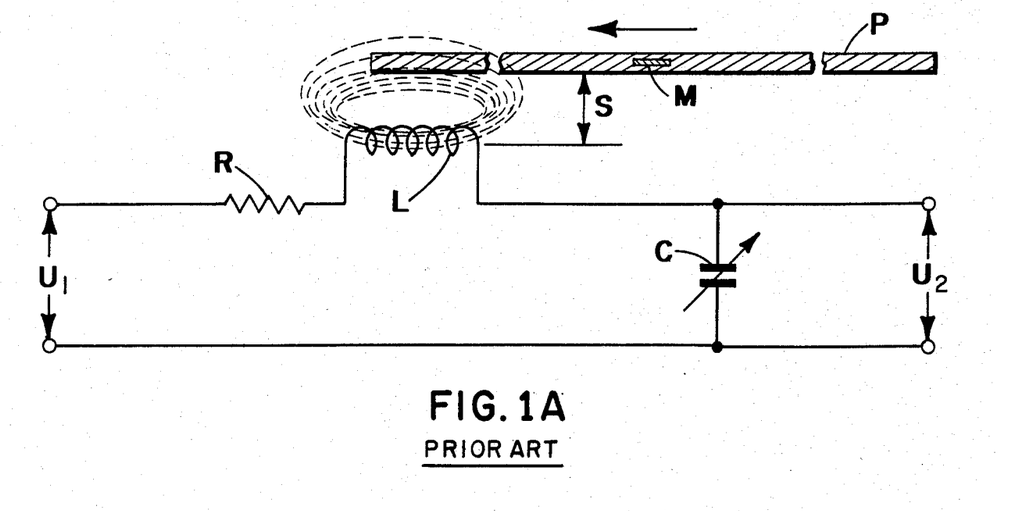
FIG. 1(a) is a schematic view showing a conventional detector for detecting a metal strip in paper money.

One known technique for detecting the metal strip embedded in paper money is disclosed in United Kingdom Patent Appication No. 2,017,996. FIG. 1(a) of the drawings of the present application illustrates the detecting system of this U.K. patent application. The detecting system includes a circuit formed by resistor R, self-induction coil L and adjustable variable capacitor C. A voltage $U_1$ having a frequency of 2 MHz is applied to this circuit and an output voltage $U_2$ is measured at the terminals of capacitor C. The high frequency output voltage $U_2$ is modulated by movement of paper money P, metal strip M in front of the coil L in the direction of the arrow. The metal strip M crosses the lines of magnetic induction generated by coil L to modulate the output voltage $U_2$. However, because of coil L is positioned on only one side of paper P, undesirable variations in the output voltage $U_2$ occur. In other words, a little variation in the space S between coil L and paper money P varies the number of lines of magnetic induction crossed by metal strip M which causes a noticeable variation in output voltage $U_2$.

Figure 1B:
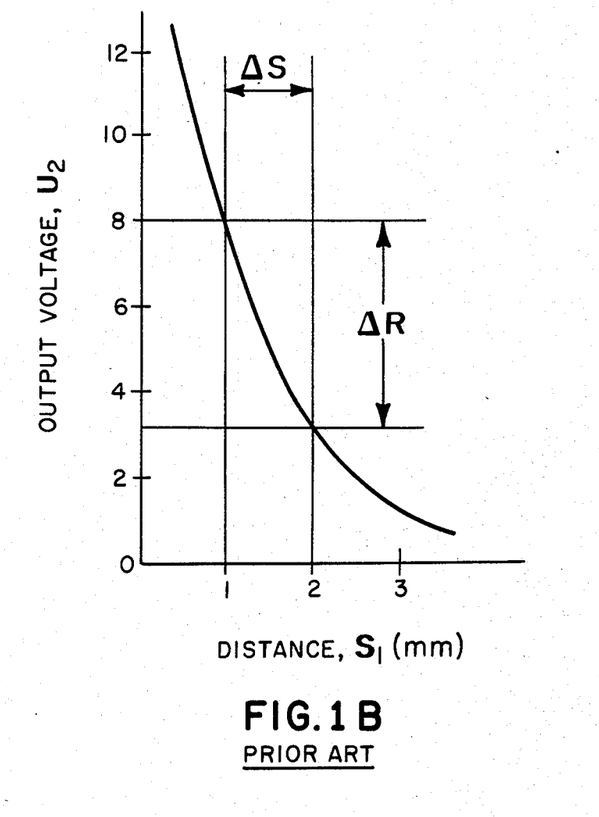
FIG. 1(b) is a graph of the output voltage as a function of space variations of the detector shown in FIG. 1(a).

The graph in FIG. 1(b) shows the variation of output voltage $U_2$ as a function of the variation in the space S between paper money P and coil L. As apparent from this graph, the variation $\Delta R$ in output voltage $U_2$ is large compared to the space variation $\Delta S$ between paper money P and coil L. Since paper money P, such as a currency note, is transported at high speed, the space between the detecting coil and the currency note cannot be maintained constant. As a result, frequent detection errors occur in this prior art detecting system.

SUMMARY OF THE INVENTION

This invention overcomes the prior art disadvantages mentioned above by providing a practical and effective detecting device for detecting a metal strip in paper money. This detecting device is capable of discriminating between genuine and counterfeit checks and currency notes.

Another object of the invention is to provide a detecting device which reliably detects the existence of a metal strip in paper money.

The detecting device according to the present invention includes a first and second induction coil mounted on opposite sides of a passageway for the paper money. The first coil is connected to an AC current source to generate an AC magnetic field. The second coil is connected to a capacitor to form a resonance circuit which resonates at the same frequency as the AC current. The variation of the Q factor of the resonance circuit due to eddy-current losses in the metal strip is detected when the metal strip in the paper money passes through the space between the first and second coils.

In the detecting device of the present invention, the paper money crosses the magnetic flux between the first and second coils. As a result, even if the space between the paper money and the first and second coils varies, the detecting device generates an output signal which can be reliably used to determine that presence of the initial strips. Furthermore, the detecting device of this invention can operate at high speed while providing improved discriminating capacity. Additionally, the second coil of the detecting device can be formed by a plurality of coils connected to a logic circuit. The plurality of second coils make it possible to detect the existence of the metal strip even when part of the metal strip has been cut or broken. Therefore, the detecting device of this invention is especially useful when the paper money has been folded during circulation, which often causes the metal strip to break.

Furthermore, in the detecting device of this invention, secure detection can be carried out when the paper money is transported in the crosswise direction or up side down. Therefore, this detecting device can be used in an automatic detecting machine to detect large quantities of paper money in a short time and with high speed.

Other objects and features of the present invention will be apparent from the following description taken in connection with the accompanying drawings.

DETAILED DESCRIPTION OF THE PREFERRED EMBODIMENT

Figures 2A, 2B, 4:
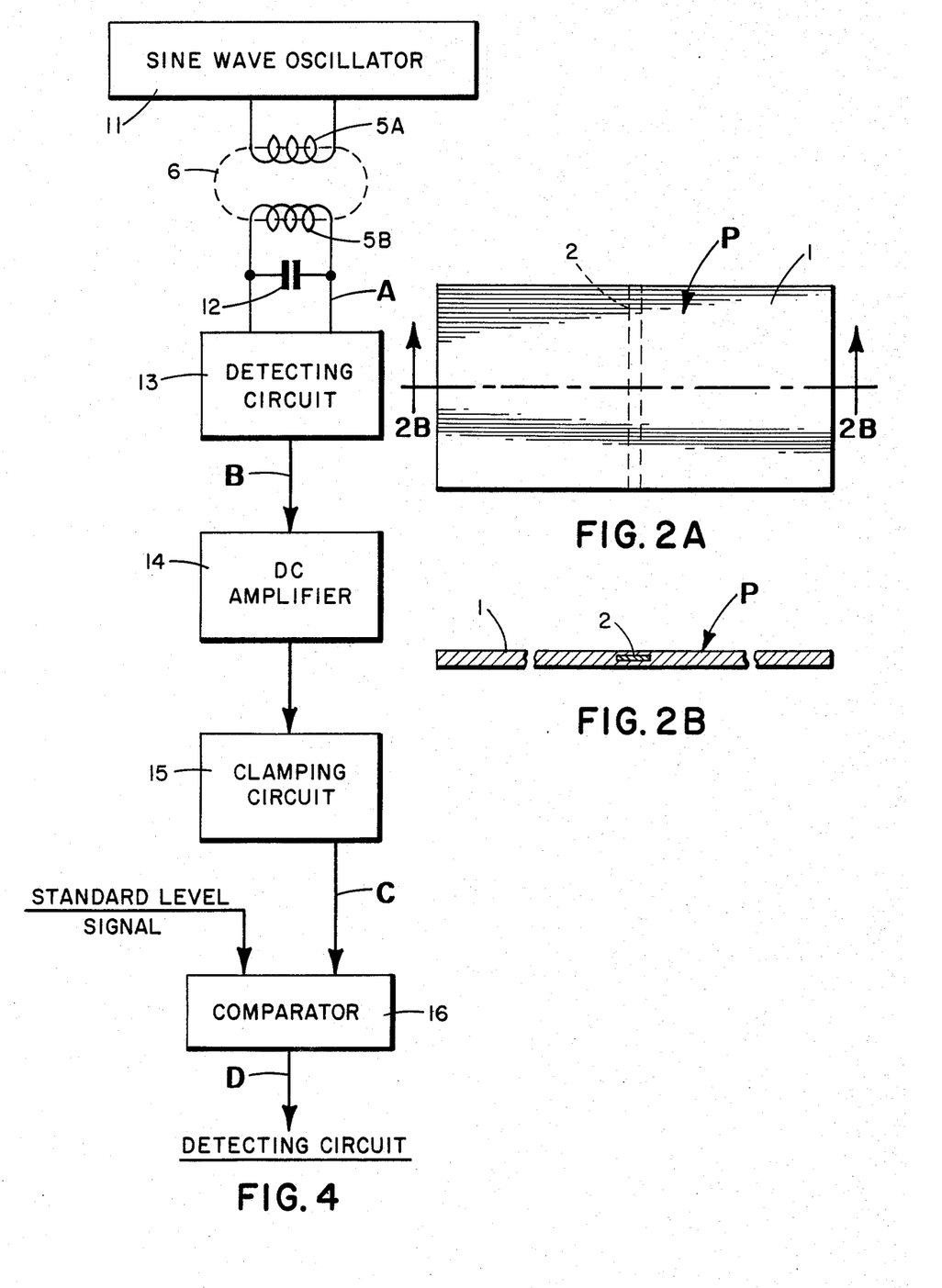
FIG. 2(a) is a plan view of paper money embedded with a metal strip.
FIG. 2(b) is a sectional view taken along line 2B—2B of FIG. 2(a).
FIG. 4 is an electric circuit diagram of the detecting device shown in FIGS. 3(a) and (b).

As shown in FIGS. 2(a) and (b), a metal strip 2 is embedded in paper money P. This metal strip 2 is made of material such as aluminum which is about 20 μm thick, has a width $l_2$ of about 0.5-1.0 mm and has a length which is the same as the width of paper 1. The metal strip 2 is embedded crosswise of the paper 1 or in a direction perpendicular to the lengthwise direction (transporting direction of paper money P) of paper 1.

Figure 3A:
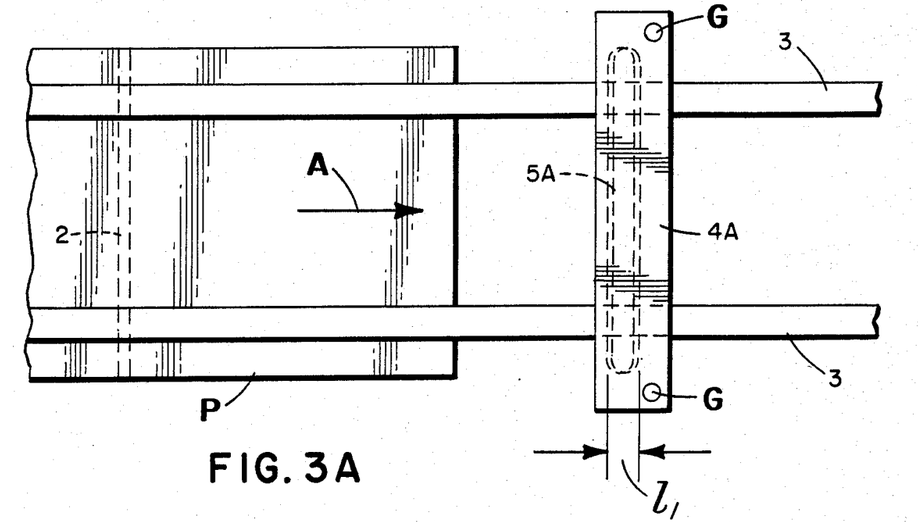
FIG. 3(a) is a plan view of a detecting device for metal strip in paper according to the present invention.
Figure 3B:
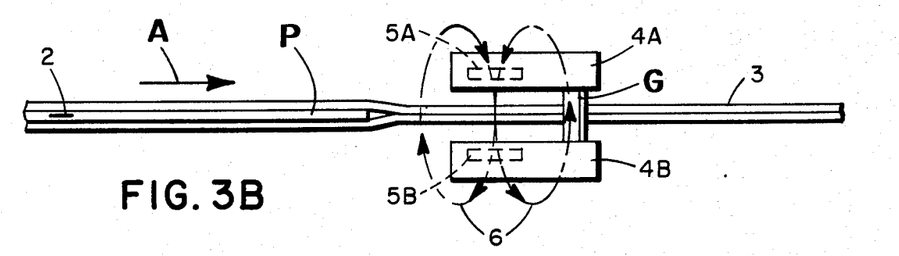
FIG. 3(b) is a side view of the detecting device shown in FIG. 3(a).

As shown in FIGS. 3(a) and (b), the paper money P is transported in the direction of arrow A through detecting heads 4A and 4B by transporting belts 3. Paper money P is transported with both sides held by the transporting belts 3 so that paper money P is positioned perpendicular to the transporting direction A. Detecting head 4A is the upper detecting head and detecting head 4B is the lower head. The detecting heads 4A and 4B are perpendicular to the transporting direction A and face each other at a spacing of about 5 mm provided by spacers G. The detecting heads 4A and 4B, which are made of epoxy resin, have long and narrow shaped wound coils 5A and 5B, respectively. Transmitting coil 5A is mounted in head 4A and receiving coil 5B is mounted in head 4B. The lateral width $l_1$ of the coils is larger than width $l_2$ of metal strip 2 in paper money P so that it is possible to reliably detect metal strip 2 even when paper money P is off center as it is transported past the coils. Each coil 5A and 5B is parallel to the surface of paper money P and perpendicular to the transportation direction A of paper money P. Paper money P is transported between these detecting heads 4A and 4B without contacting these heads 4A and 4B.

FIG. 4 shows an electric circuit connected to the coils 5A and 5B of the detecting device. The electric circuit comprises the following parts: a sine wave oscillator 11 for supplying a 1 MHz signal to transmitting coil 5A of detecting head 4A; a capacitor 12 forming a parallel resonance circuit with receiving coil 5B; a detecting circuit 13 for converting the AC signal (resonance signal) across capacitor 12 into a DC signal by envelope detecting; a DC amplifier 14 for amplifying the output signal of detecting circuit 13; a clamp circuit 15 for clamping the output signal of DC amplifier 14; and a comparator 16 for comparing the output signal of clamp circuit 15 with a predetermined signal level 17 to generate a binary signal.

Figure 5:
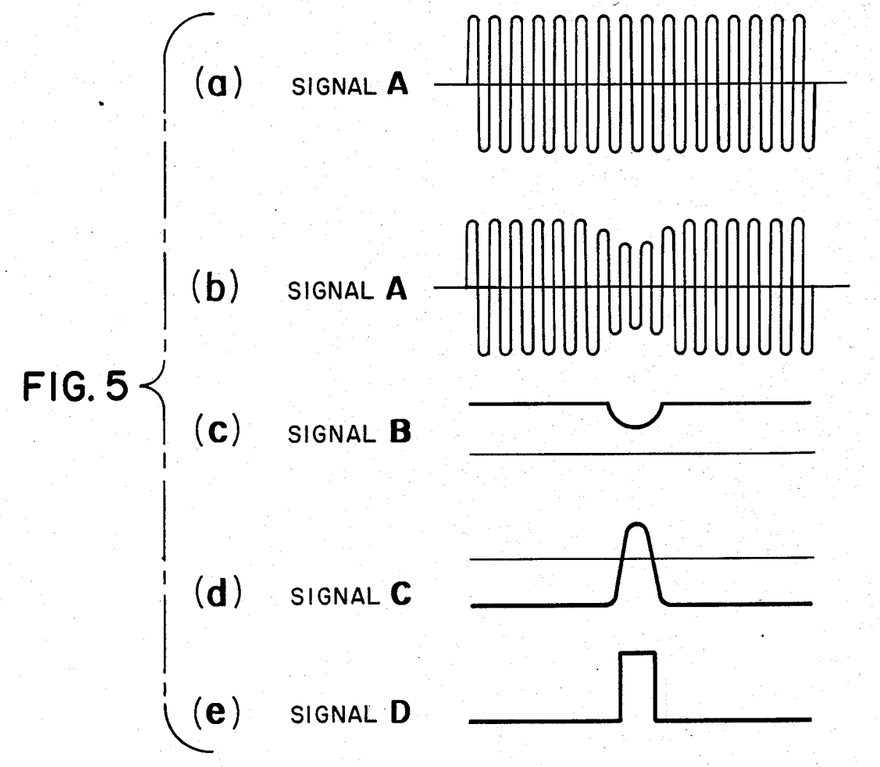
FIGS. 5(a)–(e) are signal waveform diagrams for the circuit diagram of FIG. 4.

The detecting device operates as follows. Where the 1 MHz signal is supplied to transmitting coil 5A by oscillator 11, magnetic field 6 shown in FIG. 3(b) is formed. The high frequency magnetic field 6 induces a voltage in receiving coil 5B. When paper money is not being transported, the resonance circuit formed by receiving coil 5B and capacitor 12 resonate in response to the high frequency signal in accordance with the equation $Q=\omega L/R$. The resonance signal A across capacitor 12 is shown in FIG. 5(a). In the event paper money P with metal strip 2 is transported through the space between detecting heads 4A and 4B, metal strip 2 passes through magnetic field 6. The metal strip 2 produces an eddy-current loss in the magnetic field which increases the resistance R and decreases the Q factor. As the Q factor of the resonance circuit decreases, the amplitude of resonance signal A decreases. The decreased resonance signal A is shown in FIG. 5(b) as the small amplitude part 18. The resonance signal A is detected by detecting circuit 13 which generates signal B shown in FIG. 5(c) (the envelope of AC signal in FIG. 5(b)). The output signal B of detecting circuit 13 is supplied to clamp circuit 15 after being amplified by amplifier 14. At clamp circuit 15, as shown by signal C in FIG. 5(d), signal B is clamped at a constant electric potential, except signal part 19 corresponding to detection of metal strip P. Output signal C of clamp circuit 15 is supplied to comparator 16 and converted into the binary signal D shown in FIG. 5(e) by comparison with a predetermined signal level 17. The binary signal D is transmitted to a paper discriminating device (not shown) for discriminating between genuine and counterfeit paper money P.

Figure 6:
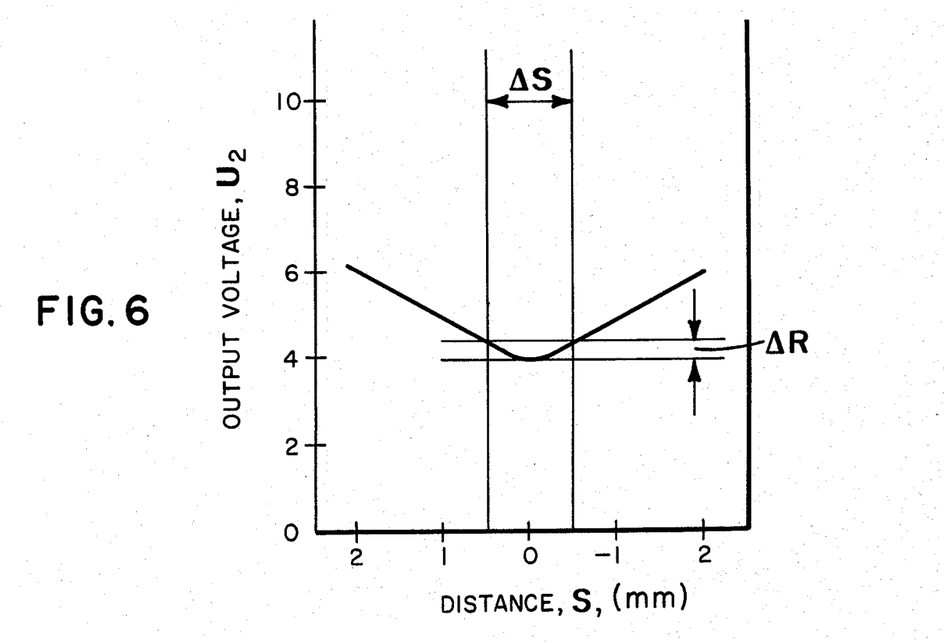
FIG. 6 is an output graph of the detecting device shown in FIG. 4.

The output characteristics of the above embodiment are shown in FIG. 6. The variation ΔR in the output signal is very small compared to the variation ΔS of the space between paper money P and detecting coil 5B. Since paper money P crosses the magnetic flux between the first and second coils 5A and 5B, the variation ΔS in the space between paper money P and detecting coil 5B has little affect on the output signal of the device. Therefore, reliable detection of metal strip 2 in paper money P can be carried out at high speed in the detecting device of the present invention.

Figure 7A:
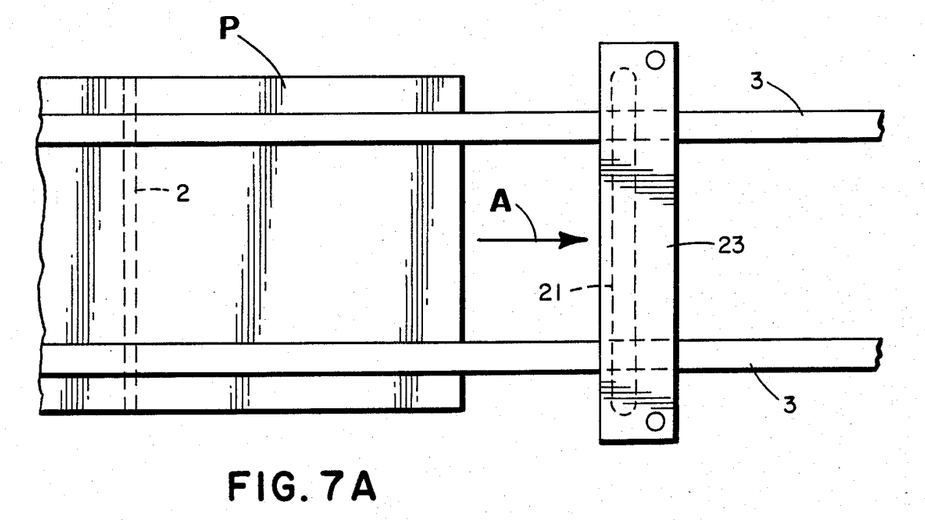
FIG. 7(a) is a plan view of another embodiment of the detecting device according to the present invention.
Figure 7B:
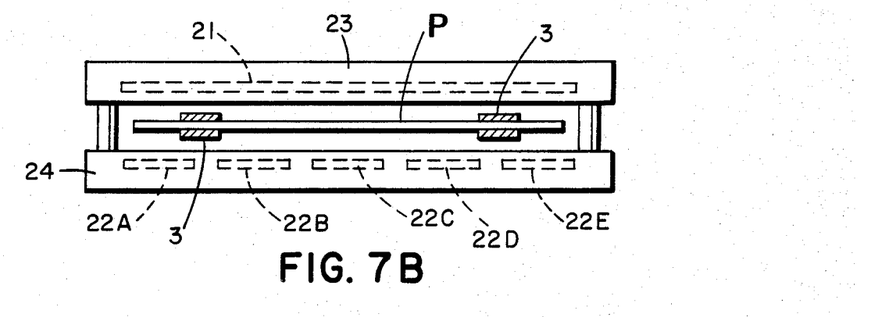
FIG. 7(b) is a side view of the detecting device shown in FIG. 7(a).
Figure 7C:
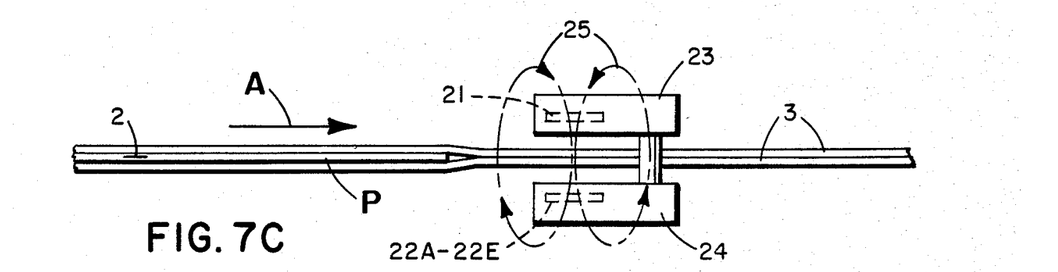

Another embodiment according to the present invention is shown in FIGS. 7(a), (b) and (c). A ring type transmitting coil 21 is embedded in the upper detecting head 23 and five ring type receiving coils 22A to 22E are embedded in the lower detecting head 24. Each coil 22A to 22E is aligned along a line normal to direction A. The lengths of transmitting coil 21 and all receiving coils 22A to 22E are longer (in the direction of travel of belts 3) than that of metal strip 2 in paper money P. High frequency magnetic field 25 induces a voltage in receiving coils 22A-E.

Figure 8:
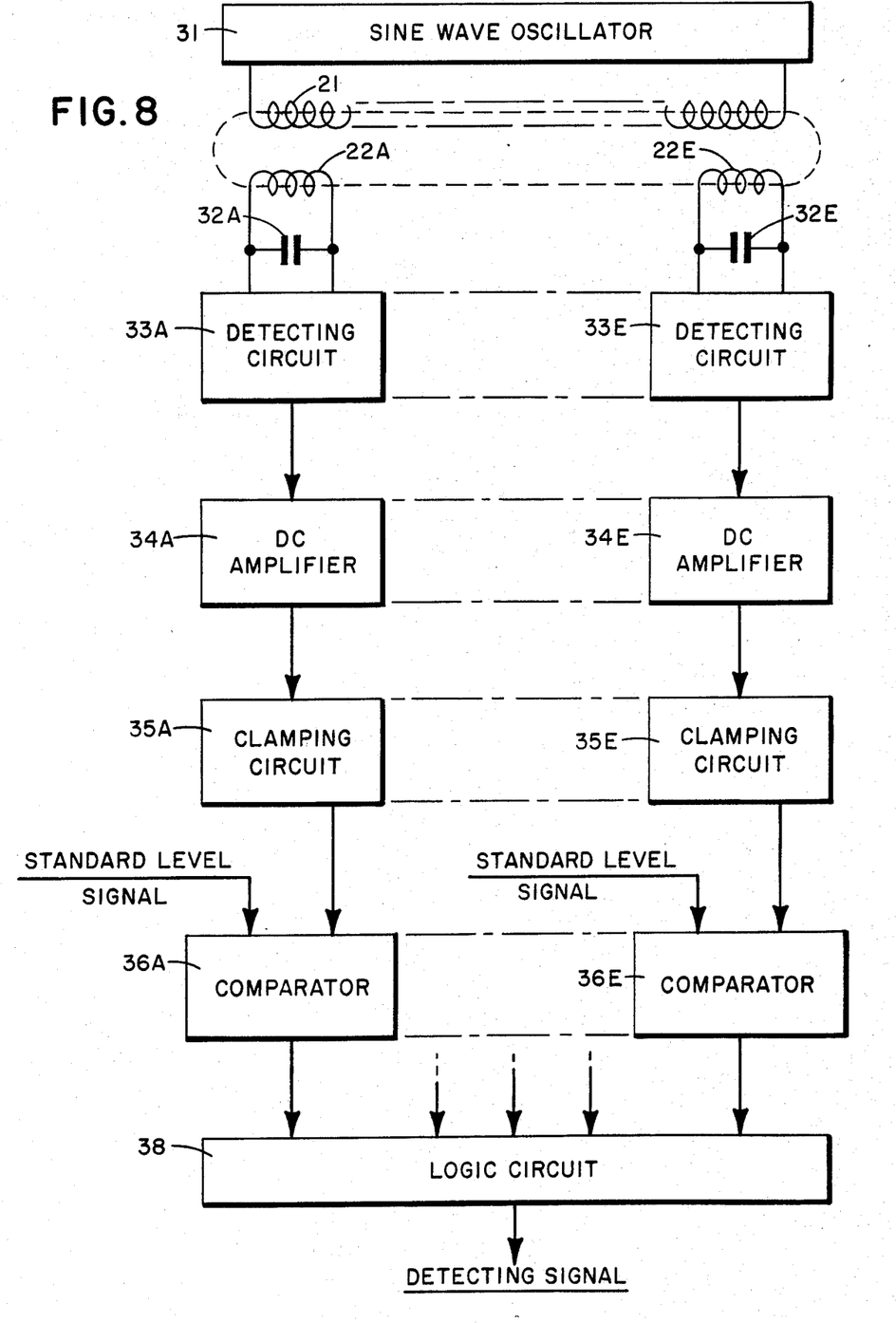
FIG. 8 is an electric circuit diagram of the detecting device shown in FIGS. 7(a) and (b).

FIG. 8 shows the electric circuit for the detector shown in FIG. 7. In this circuit, each receiving coil 22A-22E is connected, as in the aforementioned embodiment shown in FIG. 4, to one of the capacitors 32A-32E, one of the detecting circuits 33A-33E, are of the DC amplifiers 34A-34E, one of the clamp circuits 35A-35E and one of the comparators 36A-36E, respectively. Output signals of comparators 35A to 35E are supplied to a logic circuit 38 for generating the final output detecting signal. The logic circuit 38 is a standard logic circuit which is designed to output the final output detecting signal when, for instance, at least a predetermined number of comparators 36A to 36E generate metal detecting signals simultaneously. Metal strip 2 normally is a continuous metal strip embedded in paper P, but this strip 2 can be partially cut or broken when paper P is bent or folded. If metal strip 2 is broken, the output of the receiving coil corresponding to the broken portion is very small. But, in this embodiment, since the final output detecting signal from logic circuit 38 is only generated when at least three or four of the comparators 36A-36E detect metal strip 2 simultaneously, a broken portion in the metal strip does not prevent a determination that the metal strip is present. The final output detecting signal is sent to a note evaluating device (not shown) to determine whether paper P, such as a currency note, is genuine or counterfeit.

Figure 9:
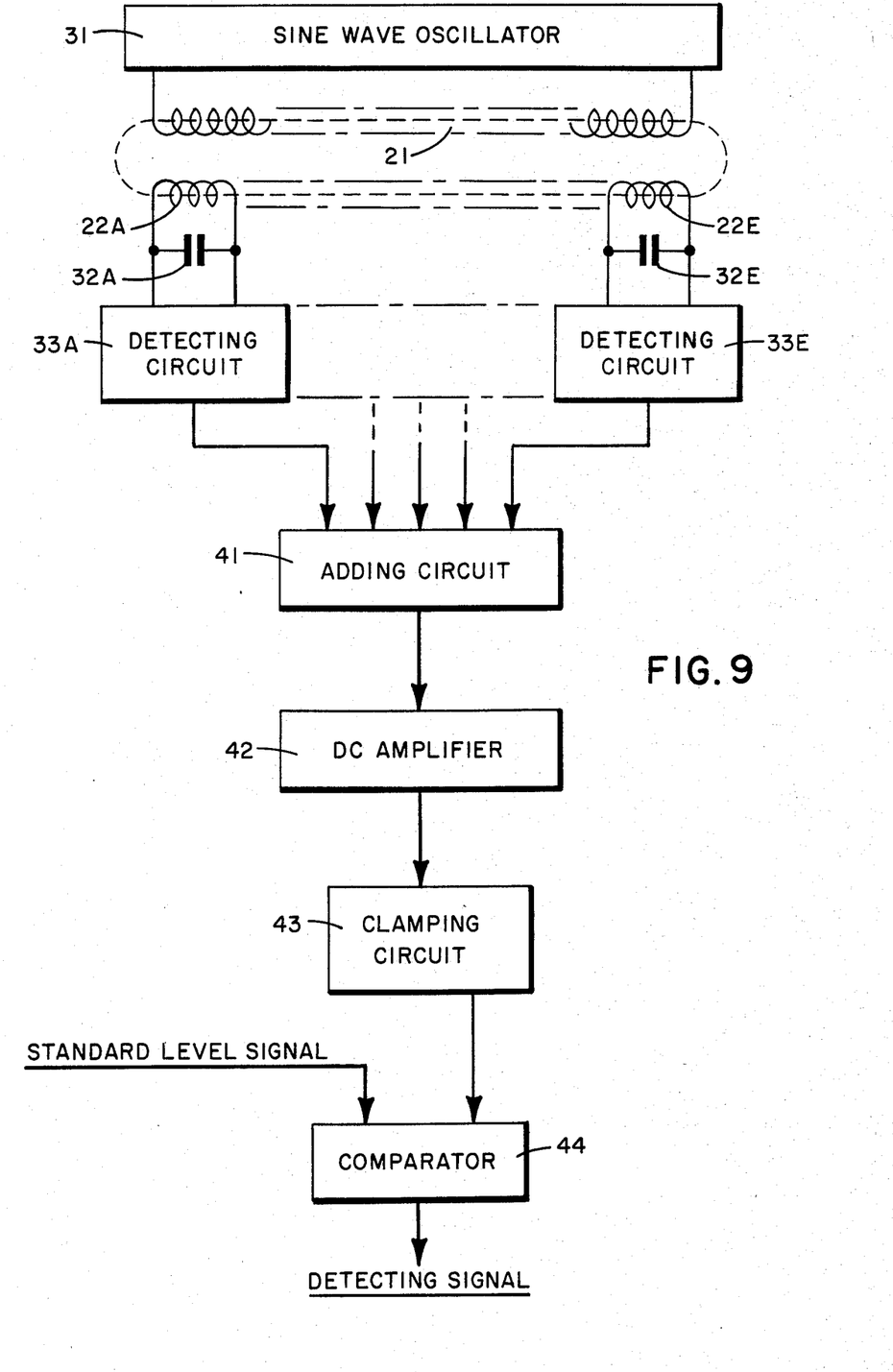
FIG. 9 is an electric circuit diagram showing a modification of the electric circuit shown in FIG. 8.

FIG. 9 shows a modification of the electric circuit of the embodiment shown in FIG. 8. In the modification, the outputs of detecting circuits 33A to 33E are combined in an adding circuit 41, amplified by a DC amplifier 42 and is clamped by a clamping circuit 43. The clamped output is converted to a binary signal by a comparator 44. Thus, the same object can be achieved as in the embodiment shown in FIG. 8. According to this modification, only one DC amplifier 42, one clamping circuit 43 and one comparator 44 are necessary, and no logic circuit 38 is needed.

Figure 10A:
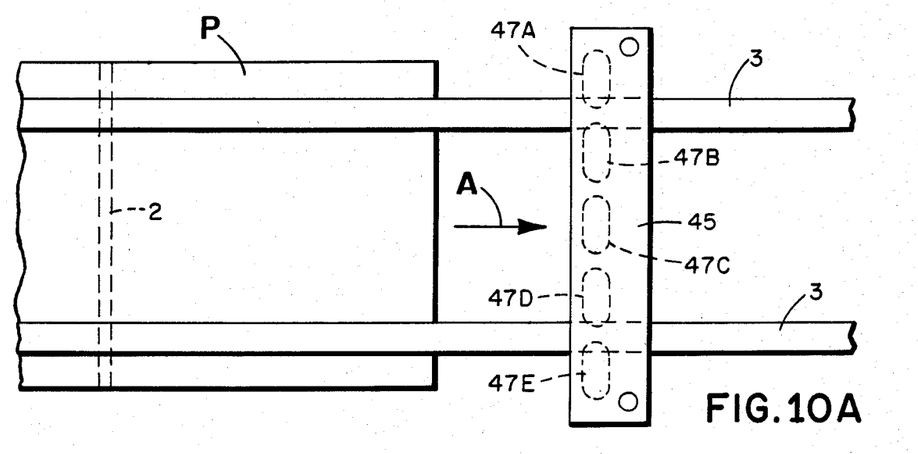
FIG. 10(a) is a plan view of another embodiment of the detecting device according to the present invention.
Figure 10B:
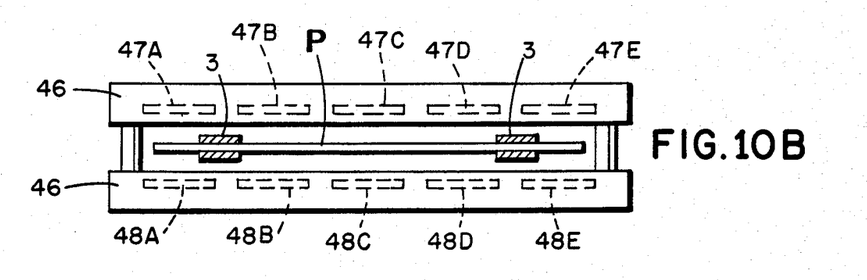
FIG. 10(b) is a front view of the detecting device shown in FIG. 10(a).
Figure 10C:
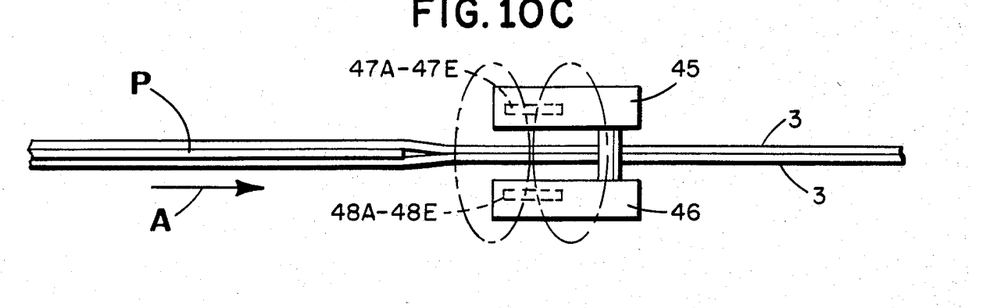
FIG. 10(c) is a side view of the detecting device shown in FIG. 10(a).
Figure 11:
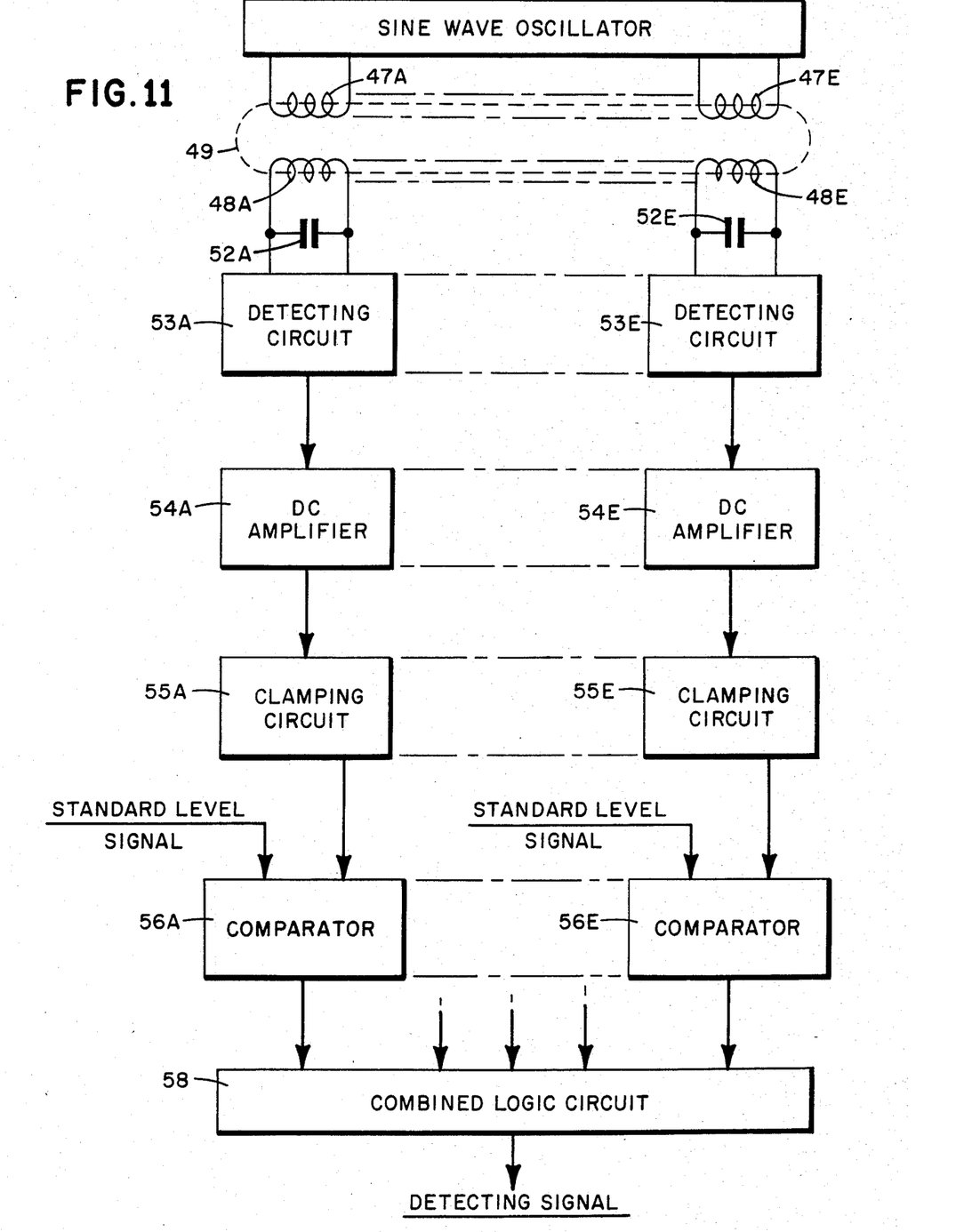
FIG. 11 is an electric circuit diagram of the detecting device shown in FIGS. 10(a), (b) and (c).
Figure 12:
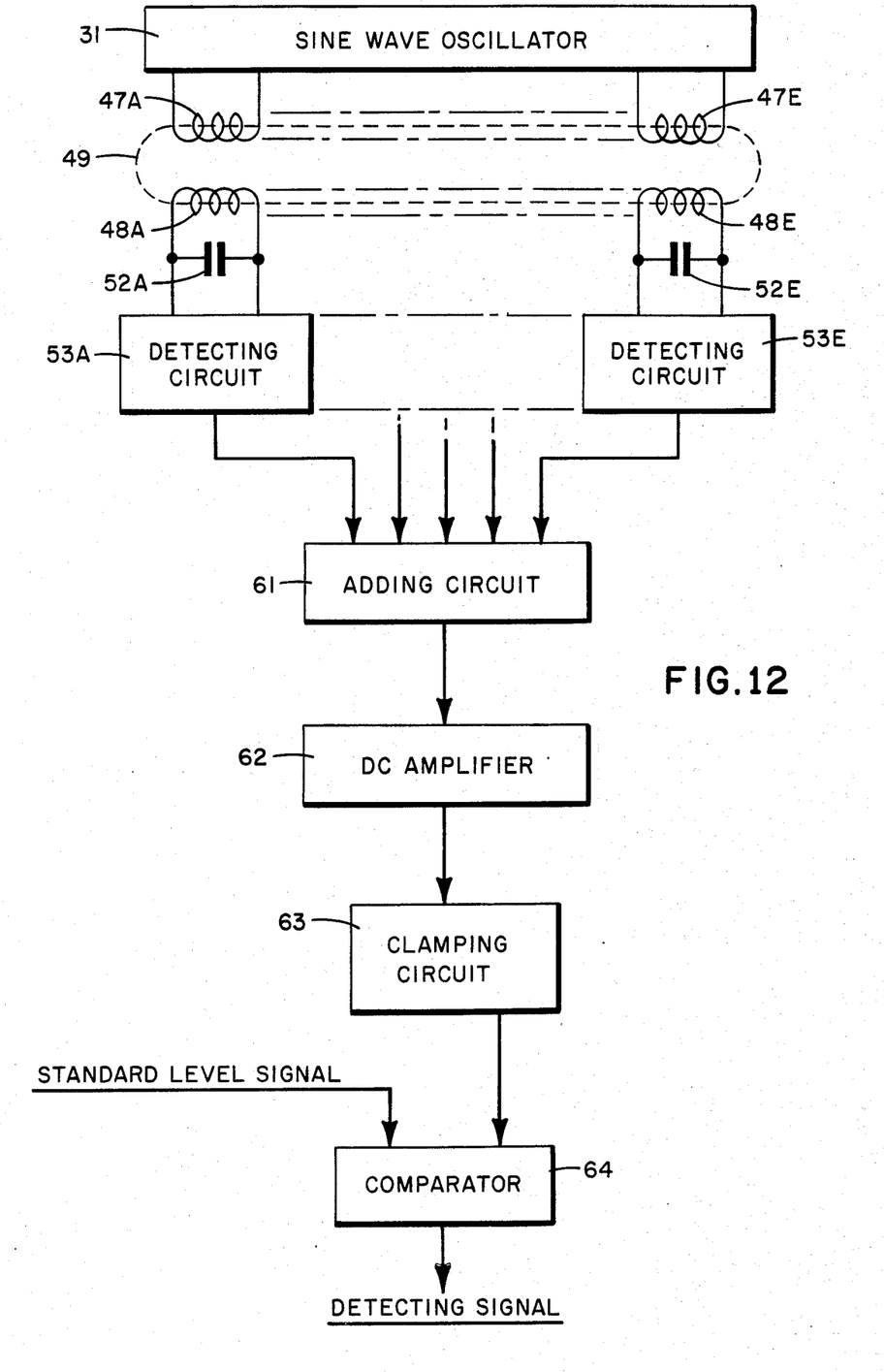
FIG. 12 is an electric circuit diagram showing a modification of the electric circuit shown in FIG. 10.

FIGS. 10(a), (b), and (c) show another embodiment of the detecting device of the present invention. In this embodiment, transmitting coil 5 is divided into five coils 47A to 47E which face receiving coils 48A to 48E, respectively. High frequency magnetic field 49 induces a voltage in receiving coils 48A-48E. The electric circuit for these embodiments are shown in FIG. 11 and FIG. 12. The circuit in FIG. 11 corresponds to that in FIG. 8, and the circuit in FIG. 12 corresponds to that in FIG. 9. The same object can be achieved as in the aforementioned embodiments.

Figure 13A:
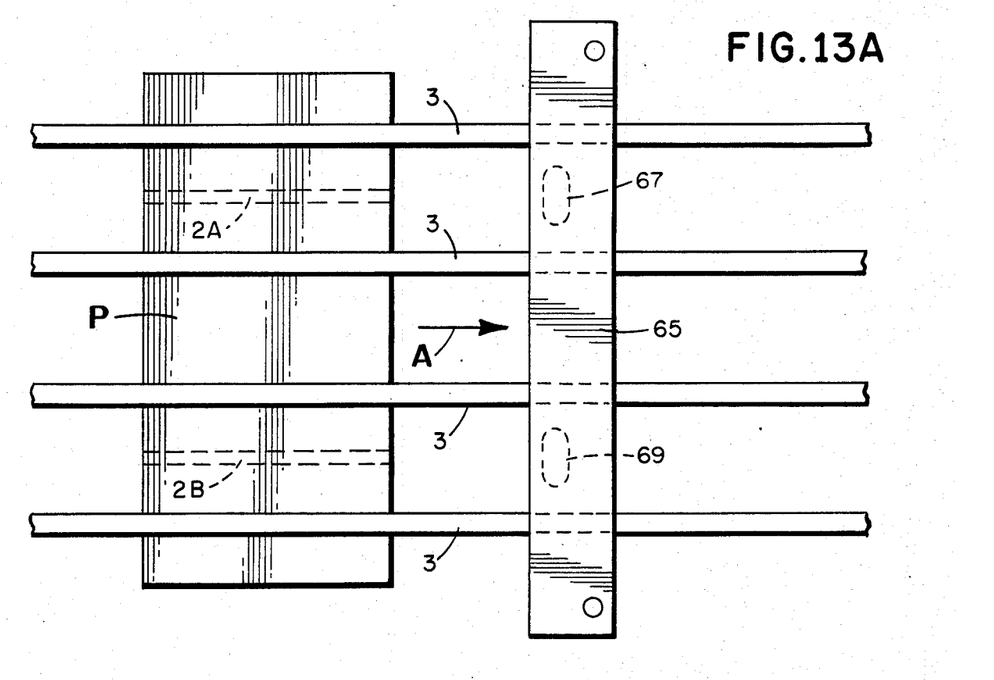
FIG. 13(a) is a plan view of still another embodiment of the detecting device according to the present invention.
Figure 13B:
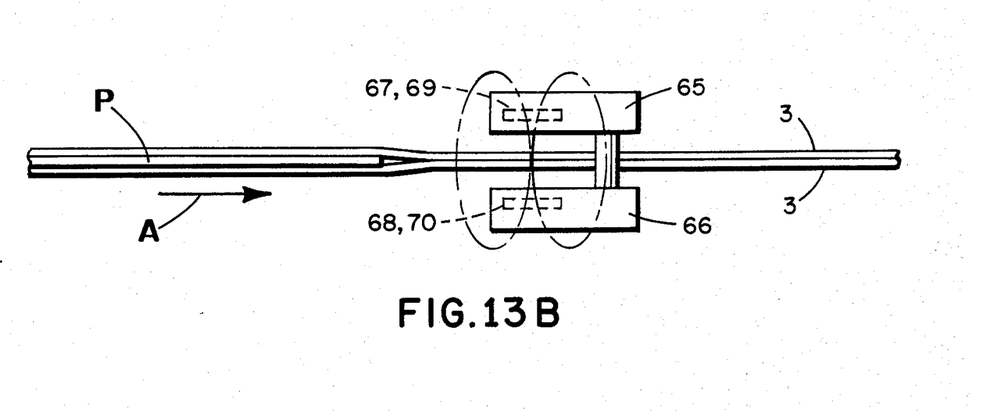
FIG. 13(b) is a side view of the detecting device shown in FIG. 13(a).

In still another embodiment of the invention shown in FIGS. 13(a), (b) and (c), paper money P is transported in the crosswise or lateral direction. Metal strip 2A in paper money P is parallel to the direction of movement on the transportation direction A. In the event the paper money P is transported up side down, the metal strip would be in the position shown by 2B in FIG. 13. Two transmitting coils 67 and 69 are formed in detecting head 65 and two receiving coils 68 and 70 are formed in corresponding detecting head 66. Transmitting coil 67 and receiving coil 68, as well as transmitting coil 69 and receiving coil 70, are arranged to face each other between transporting belts 3 at positions corresponding to metal strip 2A, 2B. The length of each coil 67–70 is greater than the width of metal strip 2A or 2B to compensate for the possible misalignment of paper money P on the transporting belts 3. Each transmitting coil 67 and 69 generates magnetic flux 71, 72 for engaging receiving coils 68 and 70.

Figure 14:
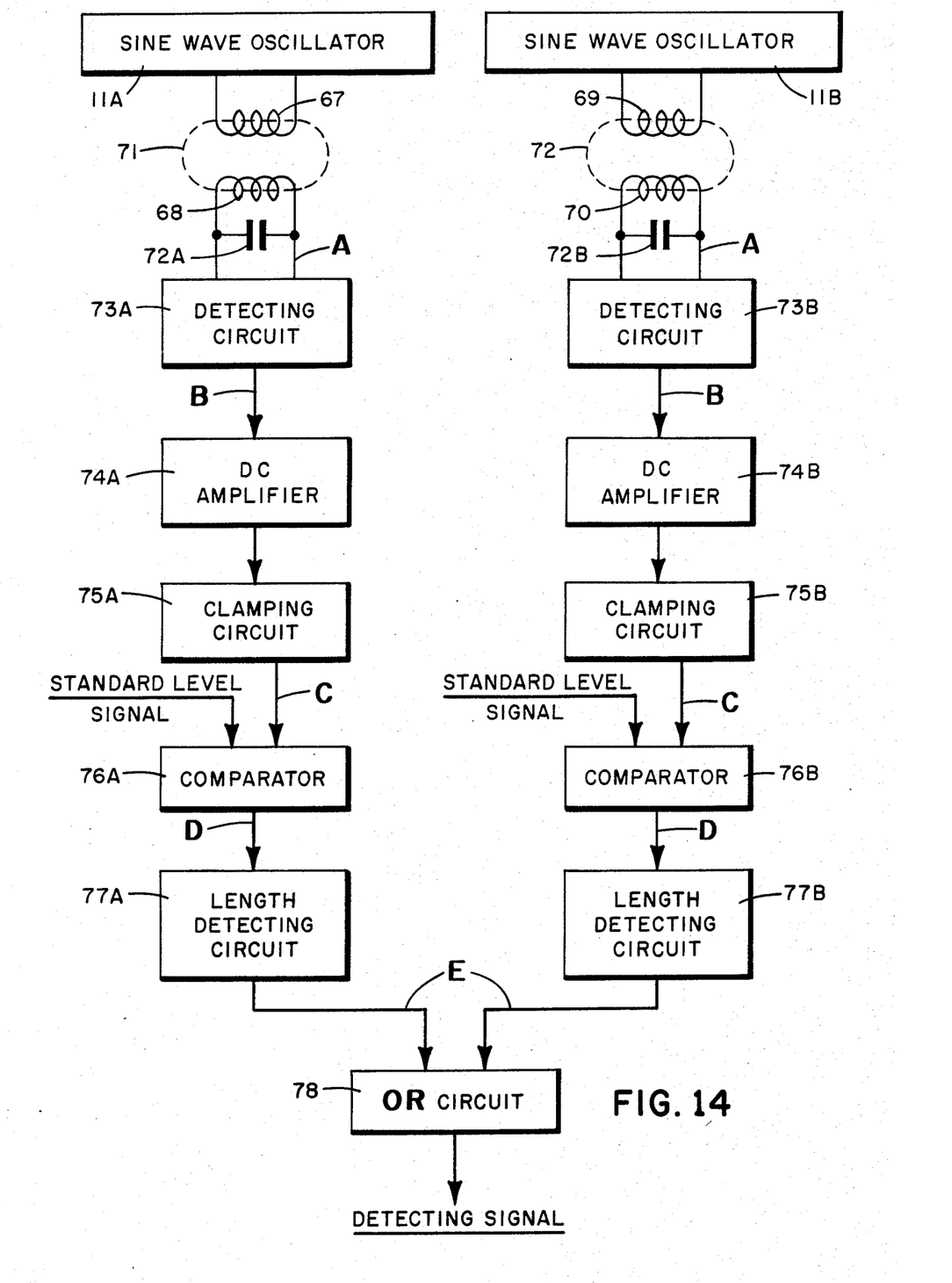
FIG. 14 is an electric circuit diagram of the detecting device shown in FIGS. 13(a) and (b).
Figure 15:
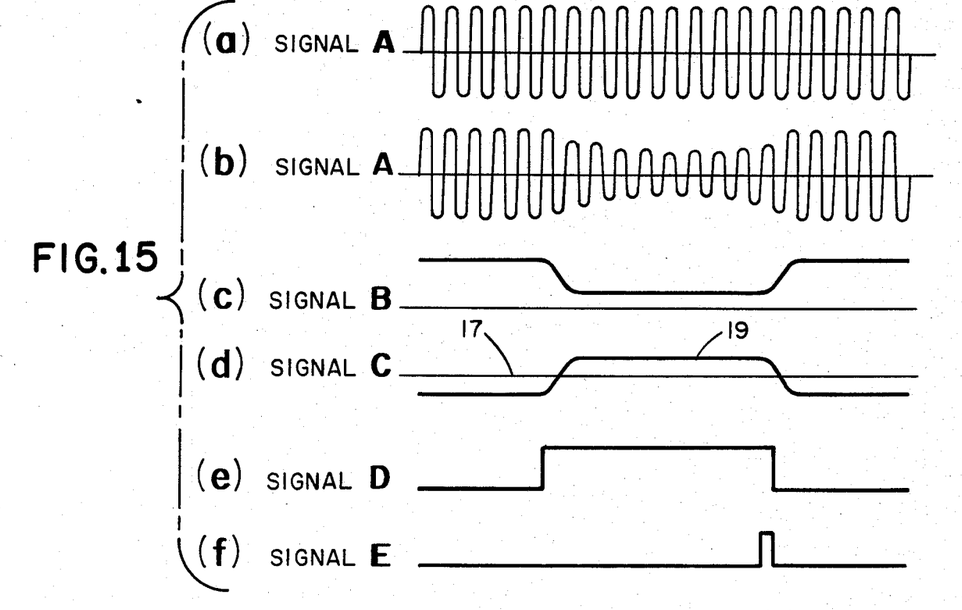
FIGS. 15(a)-(f) are signal waveform diagrams for the circuit diagram shown in FIG. 14.
Figure 16:
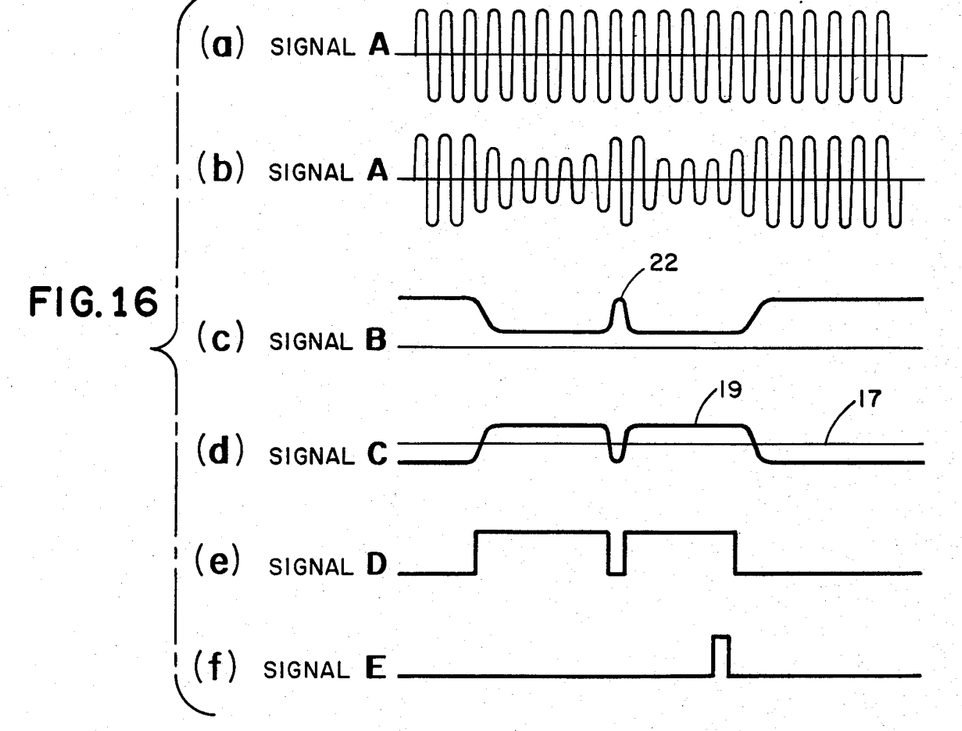
FIGS. 16(a)-(f) are signal waveform diagrams for the circuit diagram shown in FIG. 14 in the event the metal strip is cut or broken.

FIG. 14 shows the electric circuit for the detector shown in FIG. 13. Sine wave oscillators 11A and 11B supply high-frequency signals to transmitting coils 67 and 69, respectively. Each receiving coil 68, 70 is connected, as in the embodiment shown in FIG. 4, to capacitor 72A, 72B, detecting circuit 73A, 73B, DC amplifier 74A, 74B, clamp circuit 75A, 75B and comparator 76A, 76B, respectively. Output signals of comparators 76A and 76B are separately supplied to length detecting circuits 77A and 77B for measuring the time period of the binary signals of each comparator 76A and 76B. The output signals of length detecting circuits 77A and 77B are supplied to an OR circuit 78. Thus, if either length detecting circuit 77A or 77B detects a metal strip, a signal is generated by the OR circuit 78 indicating the existence of the metal strip. When the metal strip in paper money P is positioned in location 2A, the output of detecting circuit 73A is shown by signal B in FIGS. 15(c) or 16(c). FIG. 16 shows the waveforms for the circuit of FIG. 14 in the event the metal strip is cut or broken. The pulse 22 in FIG. 16(c) illustrates the response of the circuit to the broken part of the metal strip. The signal B is clamped in clamp circuit 75A, which generates signal C shown in FIG. 15(d) or FIG. 16(d). The clamp circuit 75A clamps signal B at a fixed potential, except for the detecting signal part 19 corresponding to metal strip 2. The output signal C of clamp circuit 75A is supplied to comparator 76A for comparison with the reference level signal 17, which results in a binary signal D as shown in FIGS. 15(e) or 16(e). The singal D is supplied to length detecting circuit 77A which is formed by conventional counters, and the time period is checked to determine if it is of sufficient length. When the time period is greater than a specified amount, the output signal E of FIG. 15(e) or 16(e) is generated. The output signal E is the output detecting signal of metal strip 2A. This signal is sent to a discriminating device (not shown) through OR circuit 78 and is used to determine whether paper money P is genuine or counterfeit.

Although illustrative embodiments of the invention have been described in detail with reference to the accompanying drawings, it is to be understood that the invention is not limited to those precise embodiments and that various changes and modifications may be effected therein by one skilled in the art without departing from the scope of spirit of the invention.

I claim:

1. A detecting device for detecting a sheet of genuine paper money having a longer dimension and a shorter dimension, the sheet including an embedded metal strip having a length substantially equal to the shorter dimension of the sheet and a predetermined width, the strip being oriented within the sheet so that its length is substantially parallel to the shorter dimension of the sheet, said detecting device comprising:

transporting means for rapidly transporting the sheet in the direction of its longer dimension along a transportation path;

an electric transmitting coil adjacent one side of the transportation path having a long and narrow shaped plane and having a width larger than the predetermined width of the strip, the long dimension of said long and narrow shaped plane being oriented substantially parallel to the shorter dimension of the sheet as the sheet is transported along the transportation path;

an electric receiving coil adjacent the transportation path directly opposite said transmitting coil having a long and narrow shaped plane and positioned in spaced parallel relationship to said transmitting coil along the transportation path, said receiving coil having a width larger than the predetermined width of the strip, wherein the sheet is transported between said transmitting coil and said receiving coil with the surface of the sheet being parallel to the shaped planes of said coils;

AC current supply means for supplying AC current to said electric transmitting coil to generate a magnetic field;

a capacitor connected to said electric receiving coil in a resonance circuit which generates a resonance signal; and detecting means connected to said resonance circuit for detecting variations in the resonance signal of said resonance circuit caused by eddy current losses in said metal strip when said metal strip passes between said transmitting and receiving coils.

2. A detecting device as claimed in claim 1 wherein the length of said transmitting and receiving coils is greater than the width of the sheet moving on the transportation path.

3. A detecting device as claimed in claim 1 wherein said AC current supply means is a sine wave oscillator for generating a high frequency AC signal.

4. A detecting device as claimed in claim 1 wherein said resonance circuit is a parallel resonance circuit.

5. A detecting device as claimed in claim 1 wherein said detecting means comprises a detecting circuit for detecting the resonance signal, a clamp circuit for clamping the output of said detecting circuit at a fixed potential and a comparator for converting the output of said clamp circuit into a binary signal.

6. A detecting device for detecting a sheet of genuine paper money having a longer dimension and a shorter dimension, the sheet including an embedded metal strip having a length substantially equal to the shorter dimension of the sheet and a predetermined width, the strip being oriented within the sheet so that its length is substantially parallel to the shorter dimension of the sheet, said detecting device comprising:

transporting means for rapidly transporting the sheet in the direction of its longer dimension along a transportation path;

electric transmitting coil means adjacent one side of the transportation path having a long and narrow shaped plane and having a width larger than the predetermined width of the strip, the long dimension of said long and narrow shaped plane being oriented substantially parallel to the shorter dimension of the sheet as the sheet is transported along the transportation path;

a plurality of electric receiving coil means adjacent the transportation path directly opposite said electric transmitting coil means having long and narrow shaped planes and positioned in spaced parallel relationship with said electric transmitting coil means along the transportation path, said electric receiving coil means having a width larger than the predetermined width of the strip, wherein the sheet is transported between said electric transmitting coil means and said plurality of electric receiving coil means with the surface of the sheet being parallel to the shaped planes of said coil means;

AC current means for supplying AC current to said transmitting coil means to generate a magnetic field;

a resonance element connected to each of said electric receiving coil means to form a resonance circuit which generates a resonance signal; and detecting means connected to said resonance circuits and responsive to said metal strip for generating a detecting signal, said detecting means detecting a variation in the resonance signal in each of said resonane circuits caused by eddy current losses in said metal strip when said metal strip passes between said electric transmitting coil means and said plurality of electric receiving coil means.

7. A detecting device as claimed in claim 6 wherein said electric transmitting coil means is a single electric coil.

8. A detecting device as claimed in claim 7 wherein the length of said single electric transmitting coil is greater than the shorter dimension of the sheet moving on the transportation path.

9. A detecting device as claimed in claim 6 wherein said electric transmitting coil means is formed by a plurality of electric coils.

10. A detecting device as claimed in claim 6 wherein said AC current supply means is a sine wave oscillator for generating a sine wave high frequency signal.

11. A detecting device as claimed in claim 6 wherein each of said resonance circuits is a parallel resonance circuit.

12. A detecting device as claimed in claim 6 wherein said detecting means comprises a detecting circuit for detecting each resonance signal, a clamping circuit connected to each of said detecting circuits for clamping the output of each detecting circuit to a fixed potential, a comparator connected to each of said clamping circuits for converting the output of each clamping circuit to a binary signal and a logical circuit for generating an output detecting signal by combination of a predetermined number of the outputs of each of said comparators.

13. A detecting device as claimed in claim 6 wherein said detecting means comprises a detecting circuit connected to each of said resonance circuits for detecting each resonance signal, an adding circuit connected to said detecting circuits for adding the outputs of said detecting circuits, a clamping circuit connected to said adding circuit for claming the output of said adding circuit to a fixed potential and a comparator connected to said clamping circuit for converting the output of said clamping circuit into a binary signal.

* * * * *